(12) United States Patent
Haneda (10) Patent No.: US 12,326,464 B2
(45) Date of Patent: Jun. 10, 2025

(54) AMPLIFIER CIRCUIT AND MEASUREMENT APPARATUS

(71) Applicant: HIOKI E.E. CORPORATION, Ueda (JP)

(72) Inventor: Kazuaki Haneda, Ueda (JP)

(73) Assignee: HIOKI E.E. CORPORATION, Nagano (JP)

( * ) Notice: Subject to any disclaimer, the term of this patent is extended or adjusted under 35 U.S.C. 154(b) by 198 days.

(21) Appl. No.: 18/256,744

(22) PCT Filed: Dec. 3, 2021

(86) PCT No.: PCT/JP2021/044410
§ 371 (c)(1),
(2) Date: Jun. 9, 2023

(87) PCT Pub. No.: WO2022/124220
PCT Pub. Date: Jun. 16, 2022

(65) Prior Publication Data
US 2024/0027496 A1    Jan. 25, 2024

(30) Foreign Application Priority Data
Dec. 11, 2020  (JP) .................. 2020-206343

(51) Int. Cl.
   *G01R 1/30*   (2006.01)
   *H03F 3/45*   (2006.01)
(52) U.S. Cl.
   CPC ........... *G01R 1/30* (2013.01); *H03F 3/45475* (2013.01); *H03F 2200/129* (2013.01); *H03F 2203/45526* (2013.01)
(58) Field of Classification Search
CPC . G01R 1/30; H03F 3/45475; H03F 2200/129; H03F 2203/45526;
(Continued)

(56) References Cited

U.S. PATENT DOCUMENTS

| 5,867,777 A | 2/1999 | Yamaji et al. |
| 2009/0316935 A1 | 12/2009 | Furst et al. |

(Continued)

FOREIGN PATENT DOCUMENTS

| CN | 109728787 A | 5/2019 |
| EP | 1714385 A1 | 10/2006 |

(Continued)

OTHER PUBLICATIONS

International Search Report and Written Opinion for Application No. PCT/JP2021/044410, mailed Jan. 18, 2022, 8 pages.

*Primary Examiner* — Giovanni Astacio-Oquendo
(74) *Attorney, Agent, or Firm* — Jordan IP Law, LLC (57) ABSTRACT

An amplifier circuit includes an operational amplifier to amplify an input signal input to a non-inverting input terminal, first and second feedback units to feed back an output signal output from the operational amplifier to an inverting input terminal of the operational amplifier, and a coupling unit to AC couple the second feedback unit and the inverting input terminal. The first feedback unit is to, together with the coupling unit, as a frequency of the output signal of the operational amplifier is increased, reduce an electric potential to be applied to the inverting input terminal with respect to the output signal. At the same time, the second feedback unit is to generate a predetermined electric potential lower than an electric potential of the output signal, the second feedback unit being configured to apply a predetermined electric potential to the inverting input terminal via the coupling unit.

8 Claims, 8 Drawing Sheets

(58) Field of Classification Search
CPC ......... H03F 2200/144; H03F 2200/261; H03F 2203/45138; H03F 1/34
USPC .................................. 324/123, 76.13, 76.11
See application file for complete search history.

(56) References Cited

U.S. PATENT DOCUMENTS

| | | | |
|---|---|---|---|
| 2011/0043281 A1* | 2/2011 | Golden ............... | H03F 3/45475 330/252 |
| 2020/0266781 A1* | 8/2020 | Finocchiaro ............ | B60R 11/04 |
| 2022/0021360 A1* | 1/2022 | Wei ..................... | H03F 3/45475 |

FOREIGN PATENT DOCUMENTS

| | | | |
|---|---|---|---|
| JP | 1-221005 A | 9/1989 | |
| JP | 5-167359 A | 7/1993 | |
| JP | 9-64666 A | 3/1997 | |
| JP | 2007-522741 A | 8/2007 | |
| JP | 2020014302 A | 1/2020 | |
| KR | 10-1997-001382 A | 3/1997 | |

* cited by examiner

| SETTING CONDITION | COMPARATIVE EXAMPLE | PRESENT EMBODIMENT | | | |
|---|---|---|---|---|---|
| | | CONDITION 1 | CONDITION 2 | CONDITION 3 | CONDITION 4 |
| | ———— | ---- | ▬▬▬ | —·—·— | —··—··— |
| $G_{max}$ | 57.7-FOLD | 57.7-FOLD | | | |
| $f_{fall}$ | 410Hz | 410Hz | | | |
| C | 1.1uf | 1.1uf | 440uf | 220uf | 110uf |
| R1 | – | 20.4kΩ | 50.9kΩ | 101.8kΩ | 203.5kΩ |
| R2 | 20kΩ | 2kΩ | | | |
| R3 | 353Ω | 32.1Ω | 34.0Ω | 34.6Ω | 35.0Ω |

AMPLIFIER CIRCUIT AND MEASUREMENT APPARATUS

CROSS REFERENCE TO RELATED APPLICATIONS

The present application is a U.S. National Phase Patent Application, which claims the benefit of priority to International Patent Application No. PCT/JP2021/044410 filed on Dec. 3, 2021, which itself claims priority to Japanese Application No. 2020-206343 filed Dec. 11, 2020, which is each hereby incorporated by reference in its entirety.

TECHNICAL FIELD

The present invention relates to an amplifier circuit that amplifies an input signal and a measurement apparatus.

BACKGROUND ART

JP2020-14302A discloses a non-inverting amplifier circuit that amplifies an input signal.

SUMMARY OF INVENTION

In the amplifier circuit as described above, together with a frequency component, which is an amplification object, of the input signal, other frequency components are also subjected to the amplification. As a result, if a gain of the amplifier circuit is to be increased, the other frequency components are also amplified at the same gain, and there is a risk in that the output of the amplifier circuit is saturated due to this amplification.

The present invention has been conceived in light of the above-described problem, and an object thereof is to provide an amplifier circuit capable of independently adjusting the gain and the frequency characteristic of the amplifier circuit and to provide a measurement apparatus.

In one aspect the present invention, an amplifier circuit configured to amplify an input signal input to a non-inverting input terminal of an operational amplifier includes: first and second feedback units configured to feed back an output signal output from the operational amplifier to an inverting input terminal of the operational amplifier; and a coupling unit configured to AC couple the second feedback unit and the inverting input terminal of the operational amplifier. The first feedback unit is configured to, together with the coupling unit, as a frequency of the output signal is increased, reduce an electric potential to be applied to the inverting input terminal of the operational amplifier with respect to the output signal. At the same time, the second feedback unit is configured to generate a predetermined electric potential lower than an electric potential of the output signal, the second feedback unit being configured to apply the predetermined electric potential to the inverting input terminal of the operational amplifier via the coupling unit.

According to the above-described aspect, as the frequency of the output signal of the operational amplifier is increased, the electric potential to be applied to the non-inverting input terminal of the operational amplifier is reduced by the first feedback unit and the coupling unit such that a predetermined electric potential generated at the second feedback unit is set as the lower limit. In other words, as the frequency of the output signal is increased, the gain of the amplifier circuit becomes higher because the feedback ratio of the amplifier circuit becomes smaller than unity.

Thus, while the frequency characteristic of the gain in the amplifier circuit can be adjusted by the first feedback unit and the coupling unit, the upper limit of the gain of the amplifier circuit can be adjusted by a predetermined electric potential generated at the second feedback unit. Therefore, it becomes possible to independently adjust the gain of the amplifier circuit and the frequency characteristic thereof.

DESCRIPTION OF EMBODIMENTS

The respective embodiments of the present invention will be described below with reference to the attached drawings.

First Embodiment

Figure 1:
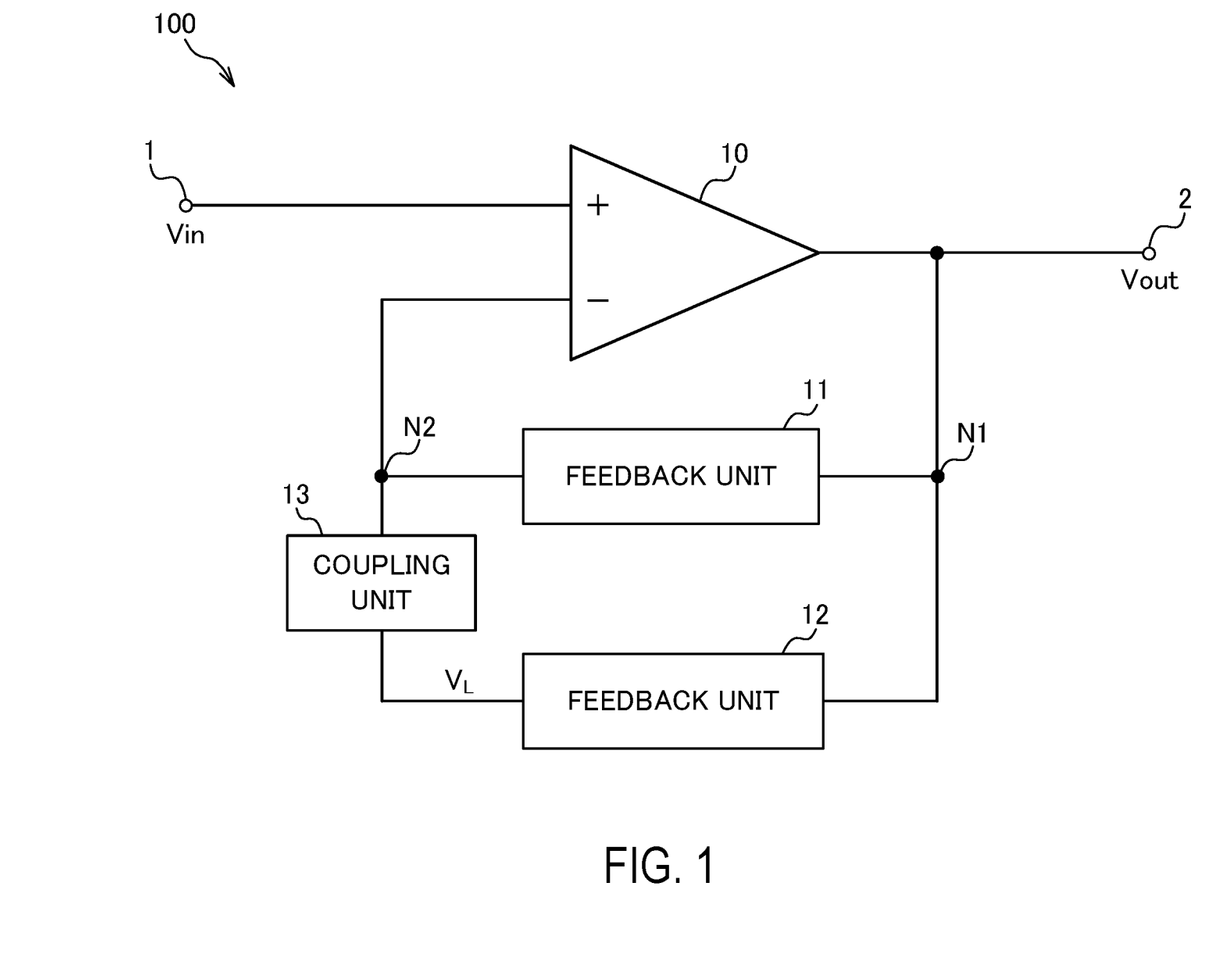
FIG. 1 is a block diagram showing a functional configuration of an amplifier circuit in a first embodiment of the present invention.

FIG. 1 is a circuit diagram showing a functional configuration of an amplifier circuit in a first embodiment.

An amplifier circuit 100 is a non-inverting amplifier circuit that amplifies and outputs a DC or AC electric signal and feeds back the output signal. Therefore, the amplifier circuit 100 has a negative feedback circuit that negatively feeds back its output signal.

The amplifier circuit 100 in this embodiment amplifies electric potential Vin of an input signal that is applied to an input terminal 1 from the outside and outputs an output signal indicating amplified electric potential Vout from an output terminal 2. Specifically, the amplifier circuit 100 is an AC amplifier circuit that amplifies a signal component of a specific frequency band, which is an amplification object, of the input signal indicating the electric potential Vin and that suppresses a noise component other than the signal component.

For example, when the lower limit of the specific frequency band is set to 1 [kHz], the amplifier circuit 100 amplifies the signal component in a high-frequency band equal to or higher than 1 [kHz] and suppresses the amplification of the noise component in a low-frequency band lower than 1 [kHz].

The amplifier circuit 100 is applied to, for example, an impedance measurement apparatus that detects an AC component of an electric potential generated in a measurement object. An example of the impedance measurement apparatus includes, for example, a battery tester.

An AC signal having a specific frequency within a range from 1 [Hz] to several [MHz] is applied to the input terminal 1 of the amplifier circuit 100 as the input signal. The electric potential Vin of the input signal indicates, for example, a value of about several tens of [mV].

The amplifier circuit 100 includes an operational amplifier 10, a first feedback unit 11, a second feedback unit 12, and a coupling unit 13. The amplifier circuit 100 amplifies the electric potential Vin of the input signal input to a non-inverting input terminal (+) of the operational amplifier 10.

The operational amplifier 10 is an error amplifier that amplifies an electric potential difference between both terminals of its non-inverting input terminal (+) and inverting input terminal (−). The operational amplifier 10 adjusts an amplification factor of the electric potential Vin in accordance with a level of a feedback signal, which is a part of the electric potential Vout of the output signal fed back to the inverting input terminal (−). In other words, the gain (the amplification factor) of the amplifier circuit 100 is determined in accordance with a feedback ratio that indicates a ratio of the electric potential of the inverting input terminal (−) to the electric potential Vout of the output terminal of the operational amplifier 10.

The operational amplifier 10 may be a general operational amplifier or a high-speed operational amplifier in which the upper limit of an effective frequency band is equal to or higher than several [MHz]. In this embodiment, the operational amplifier is configured of the high-speed operational amplifier.

The non-inverting input terminal (+) of the operational amplifier 10 is connected to the input terminal 1 of the amplifier circuit 100. The inverting input terminal (−) is connected to the feedback unit 11 and to the feedback unit 12 via the coupling unit 13.

In this embodiment, the electric potential Vout of the output signal output from the operational amplifier 10 is applied to a connection point N1 between an input terminal of the feedback unit 11 and an input terminal of the feedback unit 12. An electric potential generated at a connection point N2 between an output terminal of the feedback unit 11 and an output terminal of the coupling unit 13 is applied to the inverting input terminal (−) of the operational amplifier 10.

The feedback unit 11 is a first feedback circuit that feeds back the electric potential Vout of the output signal output from the operational amplifier 10 to the inverting input terminal (−) of the operational amplifier 10. The feedback unit 11 is arranged in a first feedback loop that is formed between the output terminal and the inverting input terminal (−) of the operational amplifier 10.

Together with the coupling unit 13, the feedback unit 11 lowers, as the frequency of the output signal from the operational amplifier 10 is increased, the electric potential to be applied to the inverting input terminal (−) of the operational amplifier 10 from the electric potential Vout of the output signal. Specifically, the feedback unit 11 and the coupling unit 13 configure a low-pass filter (LPF) that attenuates the signal component in the frequency component of the output signal from the operational amplifier 10 and passes a low-frequency component.

The term "the signal component" described above refers to a frequency component of the specific frequency band, which is the amplification object, in the input signal of the amplifier circuit 100. The term "the low-frequency component" refers to a frequency component of a frequency band, at which the gain of the amplifier circuit 100 is attenuated, in other words, a frequency band in which the frequency is lower than that of the signal component of the output signal from the operational amplifier 10. In the following, the specific frequency band is referred to as an "amplification range", and the frequency band on the lower side of the specific frequency band is referred to as an "attenuation range".

The feedback unit 11 is configured of, for example, at least one circuit element of a resistance element and an inductive element such as a coil. Alternatively, the feedback unit 11 may be configured of a combination of a capacitive element with at least one circuit element of a resistance element and an inductive element. As described above, the feedback unit 11 is configured of one or more impedance elements.

By arranging the feedback unit 11 in the amplifier circuit 100, the feedback ratio of the electric potential signal to be applied to the inverting input terminal (−) of the operational amplifier 10 is maintained at about "1.0" in the attenuation range, and the feedback ratio becomes lower than "1.0" as the frequency of the output signal is increased in the amplification range. As a result, as the frequency is increased, the gain of the amplifier circuit 100 is gradually increased from 0 [dB], and the gain of the amplifier circuit 100 reaches the upper limit near the lower limit of the amplification range and is maintained constant over the entire amplification range.

The feedback unit 12 is a second feedback circuit that feeds back the electric potential Vout of the output signal output from the operational amplifier 10 to the inverting input terminal (−) of the operational amplifier 10. In other words, the feedback unit 12 is arranged in a second feedback loop that is formed between the output terminal and the inverting input terminal (−) of the operational amplifier 10.

The feedback unit 12 generates a lower limit electric potential $V_L$ that is lower than the electric potential Vout of the output signal of the operational amplifier 10 and applies the lower limit electric potential $V_L$ to the inverting input terminal (−) of the operational amplifier 10 via the coupling unit 13.

The lower limit electric potential $V_L$ generated in the feedback unit 12 is a predetermined electric potential lower than the electric potential Vout of the output signal and is the lower limit electric potential to be applied to the inverting input terminal (−) of the operational amplifier 10. The lower limit electric potential $V_L$ serves to define the upper limit (maximum value) of the gain of the amplifier circuit 100.

The feedback unit 12 may also be configured of, for example, a converter that converts the electric potential Vout of the output signal into the lower limit electric potential $V_L$, or the feedback unit 12 may also be configured of a voltage dividing circuit that divides the electric potential Vout of the output signal. The feedback unit 12 is connected in parallel to the feedback unit 11 via the coupling unit 13.

The coupling unit 13 is a coupling circuit that AC couples the feedback unit 12 to the inverting input terminal (−) of the operational amplifier 10. The higher the frequency of the output signal is, the higher the rate (transfer rate), at which the coupling unit 13 transfers energy at the lower limit electric potential $V_L$ to the connection point N2 between the feedback unit 11 and the coupling unit 13, becomes. In other words, the coupling unit 13 increases a degree of coupling between an output terminal of the feedback unit 12 and the connection point N2 as the frequency of the output signal is increased.

In this embodiment, in the attenuation range of the amplifier circuit 100, the coupling unit 13 lowers the rate at which the lower limit electric potential $V_L$ is transferred to the connection point N2, and in the amplification range of the amplifier circuit 100, the coupling unit 13 increases the rate at which the lower limit electric potential $V_L$ is transferred to the connection point N2. The coupling unit 13 is configured of, for example, a coil, a capacitive element, or the like so as to serve as the coupling circuit that changes the transfer rate of the power in accordance with the frequency of the input signal.

By arranging the feedback unit 12 and the coupling unit 13 in the amplifier circuit 100, it is possible to maintain the electric potential generated at the connection point N2 in the amplification range of the amplifier circuit 100 at the lower limit electric potential $V_L$.

As described above, in this embodiment, the lower limit electric potential $V_L$ is applied to the coupling unit 13 by the feedback unit 12, and at the same time, the electric potential to be applied to the inverting input terminal (−) of the operational amplifier 10 in the attenuation range is made to approach the electric potential Vout of the output signal by the feedback unit 11 and the coupling unit 13. Thus, the upper limit of the gain of the amplifier circuit 100 can be adjusted by the feedback unit 12, and the attenuation range in the frequency characteristic of the gain can be adjusted by the feedback unit 11 and the coupling unit 13.

Next, a specific circuit configuration of the amplifier circuit 100 will be described with reference to FIG. 2.

Figure 2:
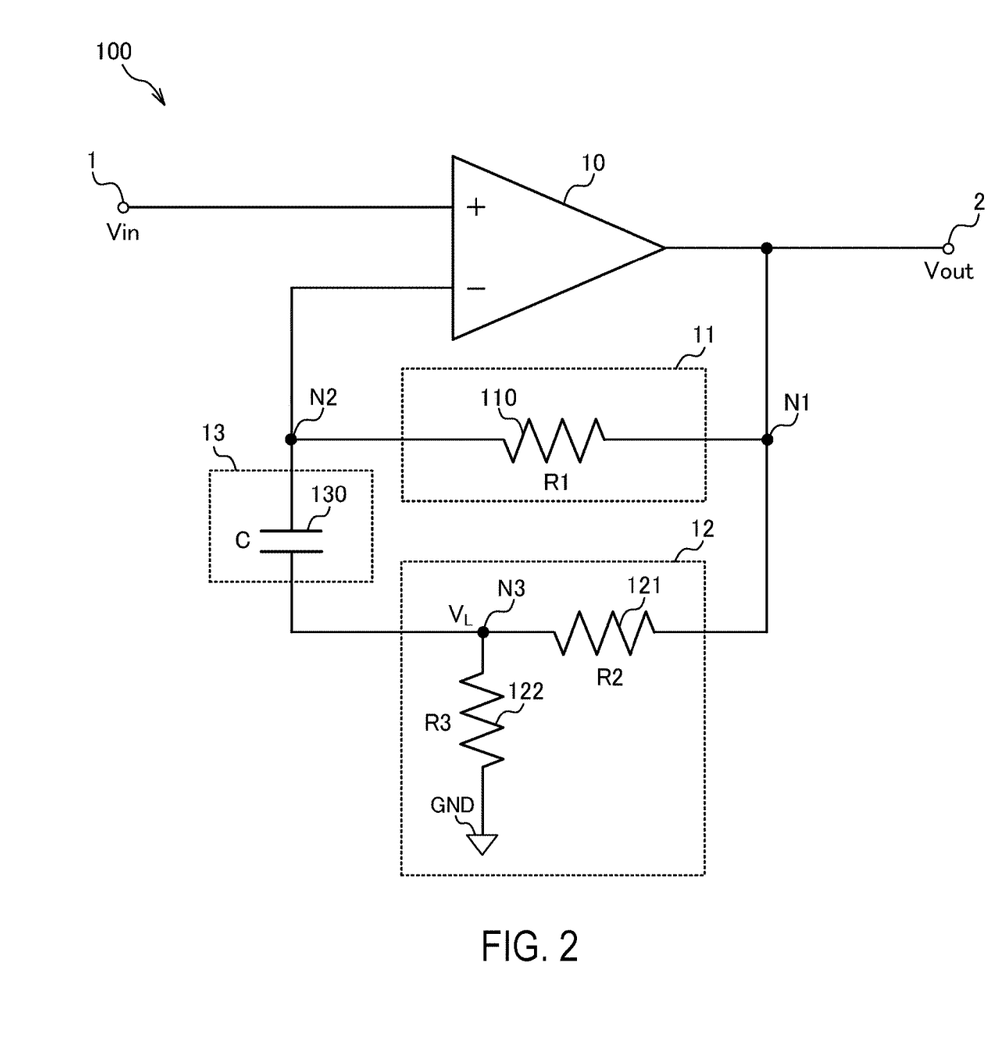
FIG. 2 is a circuit diagram showing an example configuration of the amplifier circuit.

FIG. 2 is a circuit diagram showing a specific example of the circuit configuration of the amplifier circuit 100 in this embodiment. In this example, in order to suppress an internal noise generated in the circuit elements of the amplifier circuit 100 by the current noise acting thereto, passive elements are used as the circuit elements, and the number of the passive elements are reduced.

Specifically, the feedback unit 11 is configured of a resistance element 110 that functions as a first impedance element, and the feedback unit 12 is configured of the voltage dividing circuit constituted by resistance elements 121 and 122 that respectively function as second and third impedance elements. Furthermore, the coupling unit 13 is configured of a capacitive element 130.

The resistance element 110, together with the capacitive element 130, forms a filter that passes the lower frequency component relative to the signal component of the output signal from the operational amplifier 10.

For the frequency characteristic for the gain of the amplifier circuit 100, in order to suppress the amplification of the low-frequency component of the input signal, it is preferred that the gain of a frequency band on the lower side of the signal component of the input signal be attenuated, in other words, that the attenuation range be formed on the lower frequency side. Thus, in order to form the attenuation range, a time constant with a multiplication value (R1×C) of a resistance value R1 of the resistance element 110 and a capacitance value C of the capacitive element 130 needs to be increased to some extent.

In order to increase the time constant of the amplifier circuit 100, it is necessary to increase at least one constant of the resistance value R1 of the resistance element 110 and the capacitance value C of the capacitive element 130. In this case, compared with a case in which the resistance value R1 of the resistance element 110 is increased, a size and a manufacturing cost of the amplifier circuit 100 tend to be increased in a case in which the capacitance value C of the capacitive element 130 is increased.

Therefore, in this embodiment, the resistance value R1 of the resistance element 110 is increased in preference to the capacitance value C of the capacitive element 130. For example, a resistance value R1 of the resistance element 110 is adjusted so as to be a value larger than a combined resistance value (R2+R3) of a resistance value R2 of the resistance element 121 and the resistance value R3 of the resistance element 122. By doing so, it is possible to make the capacitance value C of the capacitive element 130 relatively small, and it is possible to reduce the size and the manufacturing cost of the amplifier circuit 100.

The voltage dividing circuit configuring the feedback unit 12 generates the lower limit electric potential $V_L$ by dividing the electric potential Vout of the output signal by using the resistance element 121 and the resistance element 122. The voltage dividing circuit outputs thus-generated lower limit electric potential $V_L$ to the one end of the capacitive element 130.

In the feedback unit 12 configured of the voltage dividing circuit, the one end of the resistance element 121 is connected to the one end of the resistance element 110 and the output terminal of the operational amplifier 10, and the other end of the resistance element 121 is connected to the one end of the resistance element 122 and the one end of the capacitive element 130. The other end of the resistance element 122 is connected to a reference electric potential serving as a reference of the electric potential Vin of the input signal.

In this embodiment, the resistance element 122 is a voltage dividing resistor and is connected between a housing or a wiring having the reference electric potential and a connection point N3 between the resistance element 121 and the capacitive element 130. As an example of the reference electric potential, a ground electric potential GND indicating about 0 [V] is used.

The lower limit electric potential $V_L$ generated in the feedback unit 12 is changed in accordance with the ratio (R2/R3) the resistance value R2 of the resistance element 121 to the resistance value R3 of the resistance element 122. For example, as the lower limit electric potential $V_L$ becomes lower than the electric potential Vout of the output signal, the upper limit of the gain of the amplifier circuit 100 becomes higher.

In addition, in order to increase the upper limit of the gain of the amplifier circuit 100, it is preferred that the resistance value R2 of the resistance element 121 be set to be larger than the resistance value R3 of the resistance element 122 such that the lower limit electric potential $V_L$ becomes lower. Thus, in this embodiment, for the above-described ratio (R2/R3), the resistance value R2 and the resistance value R3 are adjusted such that the upper limit of the gain of the amplifier circuit 100 becomes about 50-fold.

In addition, in order to reduce the noise mixed in the feedback signal in each of the resistance elements 121 and 122, it is preferred that both of the resistance value R2 of the resistance element 121 and the resistance value R3 of the resistance element 122 be set to small values.

In contrast, the resistance element 110 is a circuit element for mainly defining the attenuation range of the amplifier circuit 100, and the influence of the noise generated in the resistance element 110 in the amplification range to the output signal of the amplifier circuit 100 is minor compared with that of the resistance elements 121 and 122. Thus, in this embodiment, the combined resistance value (R2+R3) of the resistance element 121 and the resistance element 122 is set to a value smaller than the resistance value R1 of the resistance element 110.

The capacitive element 130 is an electrostatic capacity for capacitive coupling the feedback unit 12 and the inverting input terminal (−) of the operational amplifier 10. The capacitive element 130 applies the lower limit electric potential $V_L$ to the connection point N2 between the inverting input terminal (−) of the operational amplifier 10 and the other end of the capacitive element 130, mainly in the amplification range of the amplifier circuit 100.

The capacitive element 130 may be a general capacitor, or the capacitive element 130 may be a ceramic capacitor in which a change in the capacitance value due to its temperature change or aging deterioration is smaller compared with a general capacitor.

In this embodiment, the capacitive element 130 is configured of the ceramic capacitor. The ceramic capacitor includes a temperature compensating ceramic capacitor in which variation of the capacitance value due to changes in an environment is relatively small, a high dielectric constant ceramic capacitor in which the electrostatic capacity per unit area and unit cost is relatively large, or the like. In order to suppress the variation of the gain of the amplifier circuit 100, it is preferable to use the temperature compensating ceramic capacitor.

In a case in which the capacitive element 130 is configured of the temperature compensating ceramic capacitor, as described above, by increasing the resistance value R1 of the resistance element 110 in preference to the capacitance value C of the capacitive element 130, it is possible to reduce the size and the manufacturing cost of the amplifier circuit 100.

Next, operation of the amplifier circuit 100 illustrated in FIG. 2 will be briefly described.

For a DC component and the neighboring low-frequency component in the input signal of the amplifier circuit 100, the capacitive element 130 functions as an insulating element that blocks these components. In other words, in DC (Direct Current) and the neighboring frequency band thereof in the attenuation range of the amplifier circuit 100, the capacitive element 130 is in an open state.

Thus, for the connection point N2, the lower limit electric potential $V_L$ generated at the connection point N3 is blocked by the capacitive element 130. On the other hand, the electric potential Vout of the output signal generated in the connection point N1 is applied to the connection point N2 via the resistance element 110.

Therefore, the electric potential corresponding to the electric potential Vout of the output signal is generated at the connection point N2. Thus, the feedback ratio of the amplifier circuit 100 becomes the maximum value indicating "1.0", and the gain of the amplifier circuit 100 is attenuated to 0 [dB].

As the frequency is increased in the attenuation range of the amplifier circuit 100, the signal tends to flow from the connection point N2 to the ground electric potential GND via the capacitive element 130, and so, the electric potential generated at the connection point N2 is decreased. Therefore, the feedback ratio of the amplifier circuit 100 is decreased from "1.0", and the gain of the amplifier circuit 100 is increased from 0 [dB].

For a high frequency component, which is the amplification object, in the input signal, the capacitive element 130 functions as a short-circuit element for passing the high frequency component. In other words, in the amplification range of the amplifier circuit 100, the capacitive element 130 is in a short-circuited state.

Thus, the lower limit electric potential $V_L$ generated at the connection point N3 is applied to the connection point N2 by the capacitive element 130. On the other hand, the electric potential Vout of the output signal generated at the connection point N1 is attenuated by the low-pass filter that is configured of the resistance element 110 and the capacitive element 130. Thus, the electric potential that is transmitted from the connection point N1 to the connection point N2 becomes sufficiently lower compared with the lower limit electric potential $V_L$ generated at the connection point N3.

Therefore, the electric potential corresponding to the lower limit electric potential $V_L$, which is generated at the connection point N3, is generated at the connection point N2. Therefore, the feedback ratio of the amplifier circuit 100 becomes the minimum value, and the gain of the amplifier circuit 100 reaches the upper limit, for example, about 50-fold.

At this time, an upper limit $G_{max}$ of the gain of the amplifier circuit 100 can be expressed by the following equations (1) and (2) by using the resistance value R1 of the resistance element 110, the resistance value R2 of the resistance element 121, and the resistance value R3 of the resistance element 122.

[Numerical Equation 1]

$$G_{max} = \frac{R1 \| R2}{R3} + 1 \qquad (1)$$

$$R1 \| R2 = \frac{R1 \cdot R2}{R1 + R2} \qquad (2)$$

In this embodiment, the resistance value R2 of the resistance element 121 is set to a value smaller than the resistance value R1 of the resistance element 110. Therefore, the combined resistance value (R1∥R2) of the resistance element 110 and the resistance element 121 becomes slightly smaller than the resistance value R2 of the resistance element 121. In other words, for the combined resistance value (R1∥R2), the resistance value R2 of the resistance element 121 is dominant.

Thus, when the resistance value R2 of the resistance element 121 is changed, in the same manner as the change, the upper limit $G_{max}$ of the gain of the amplifier circuit 100 is also changed. Therefore, by adjusting the resistance value R2 of the resistance element 121, it is possible to adjust the upper limit $G_{max}$ of the gain.

In addition, in this embodiment, the resistance value R3 of the resistance element 122 is set to a value smaller than the resistance value R1 of the resistance element 110. Therefore, compared with a case in which the resistance value R3 of the resistance element 122 is larger than the resistance value R1 of the resistance element 110, the amount of change of the upper limit $G_{max}$ of the gain with respect to the amount of change in the resistance value R2 of the resistance element 121 is increased.

In addition, when the resistance value R3 is set to a value smaller than the resistance value R1, compared with a case in which the resistance value R3 is larger than the resistance value R1, it is possible to make the upper limit $G_{max}$ of the gain higher. As described above, by increasing or decreasing at least one of the resistance value R2 of the resistance element 121 and the resistance value R3 of the resistance element 122, it is possible to make the upper limit $G_{max}$ of the gain higher.

As described above, in this embodiment, the resistance value R1 of the resistance element 110 is set to a value larger than each of the resistance values R2 and R3 of the resistance elements 121 and 122. As a result, the amount of change of the upper limit $G_{max}$ of the gain due to the change in the resistance value R1 of the resistance element 110 becomes sufficiently small, and so, it is possible to increase a degree of freedom for the adjustment of the resistance value R1 of the resistance element 110.

Next, the frequency characteristic of the gain in the amplifier circuit 100 shown in FIG. 2 will be described with reference to FIG. 3.

Figure 3:
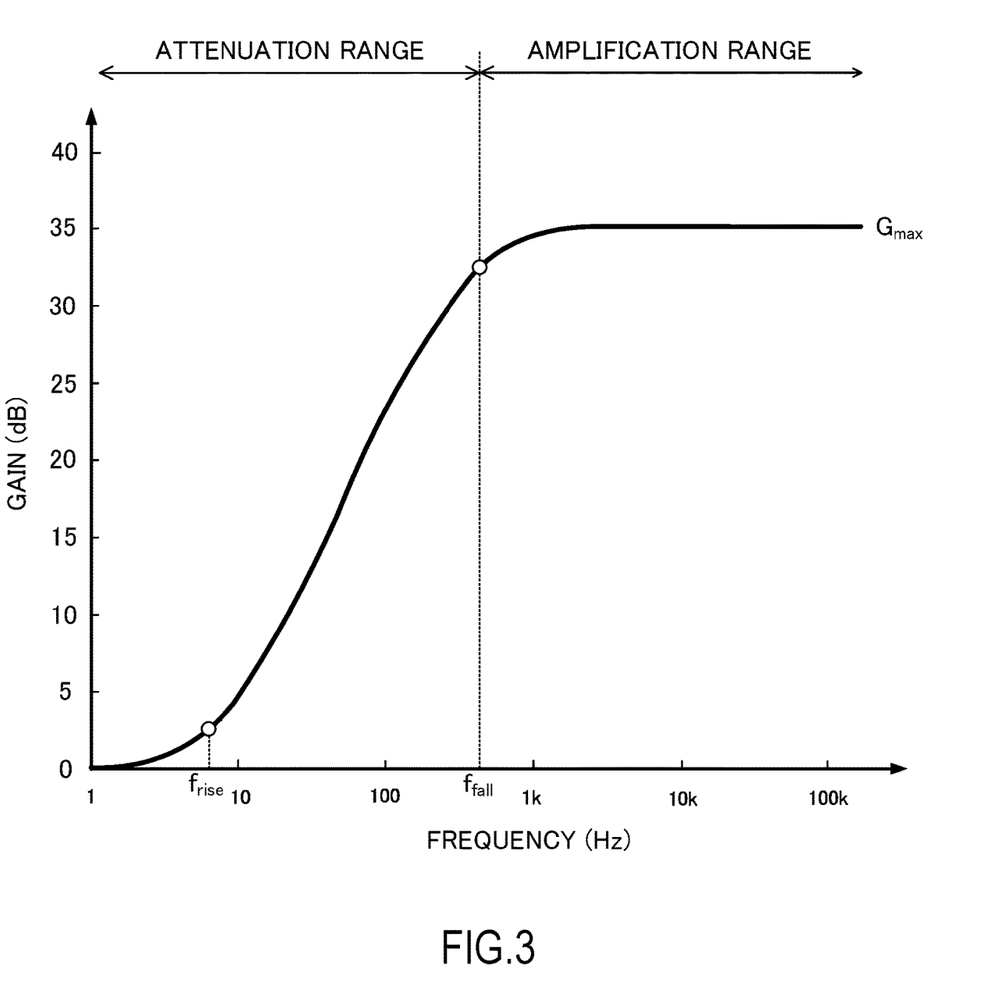
FIG. 3 is a diagram showing an example of a frequency characteristic of a gain of the amplifier circuit.

FIG. 3 is a diagram showing an example of a relationship between the gain and the frequency in the amplifier circuit 100. In the following, the vertical axis represents gain, and the horizontal axis represents frequency.

FIG. 3 shows a rising frequency $f_{rise}$ and a falling frequency $f_{fall}$. The rising frequency $f_{rise}$ is the frequency when the gain is increased from 0 [dB] by +3 [dB], and the falling frequency $f_{fall}$ is the frequency when the gain is decreased from the upper limit $G_{max}$ by +3 [dB]. In this example, the upper limit $G_{max}$ of the gain is 57.7-fold.

The upper limit $G_{max}$ of the gain in the amplifier circuit 100 is predominantly determined by the ratio (R2/R3) of the resistance value of the resistance element 121 to the resistance value of the resistance element 122. For example, the higher the ratio (R2/R3) of the resistance value of the resistance element 121 to the resistance value of the resistance element 122 is, the higher the upper limit $G_{max}$ of the gain becomes.

In addition, the frequency characteristic of the attenuation range in the amplifier circuit 100 is predominantly determined by the multiplication value (R1×C) of the resistance value R1 of the resistance element 110 and the capacitance value C of the capacitive element 130. Thus, as shown in FIG. 3, in order to form the attenuation range in the frequency band on the lower side of the signal component of the input signal in the amplifier circuit 100, it is necessary to increase the multiplication value (R1×C) of the resistance element 110 and the capacitive element 130 to some extent. Therefore, by increasing at least one value of the resistance element 110 and the capacitive element 130, it is possible to attenuate the gain in the low-frequency band of the amplifier circuit 100.

As described above, according to the amplifier circuit 100 of this embodiment, the upper limit $G_{max}$ of the gain and the frequency characteristic of the gain can be adjusted independently, and so, the degree of freedom for designing the circuit element is improved. For example, it is possible to make the resistance values R2 and R3 smaller such that the noise generated in the resistance elements 121 and 122 becomes smaller.

Next, the noise characteristic of the amplifier circuit 100 shown in FIG. 2 will be described.

Figure 8:
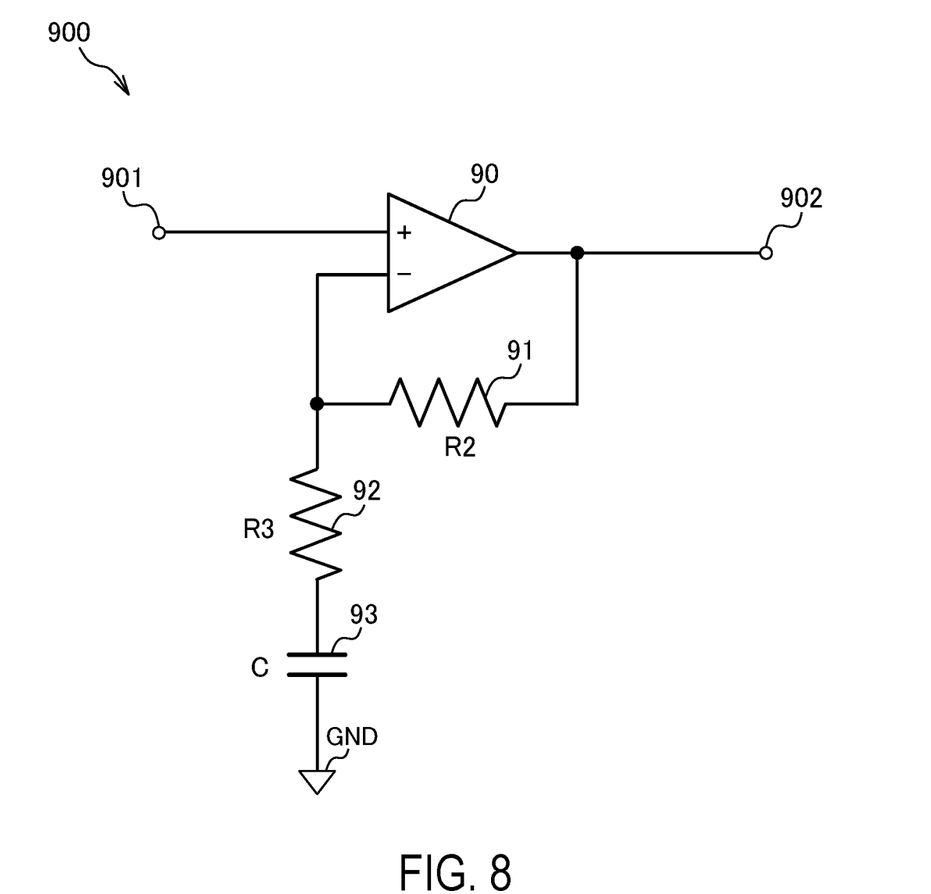
FIG. 8 is a circuit diagram showing a configuration of a non-inverting amplifier circuit in a comparative example.

For explaining the noise characteristic of the amplifier circuit 100, in the following, a non-inverting amplifier circuit 900 shown in FIG. 8 is exemplified as a comparative example of the amplifier circuit 100. The non-inverting amplifier circuit 900 according to the comparative example is configured so as to have a single feedback unit only and includes a pair of resistance elements 91 and 92 configuring, together with an operational amplifier 90, the voltage dividing circuit, and a capacitive element 93 that is connected between the resistance element 92 and the ground electric potential GND.

The frequency characteristic of a thermal noise component in the amplifier circuit 100 will be described with reference to FIGS. 4A and 4B.

Figure 4A:
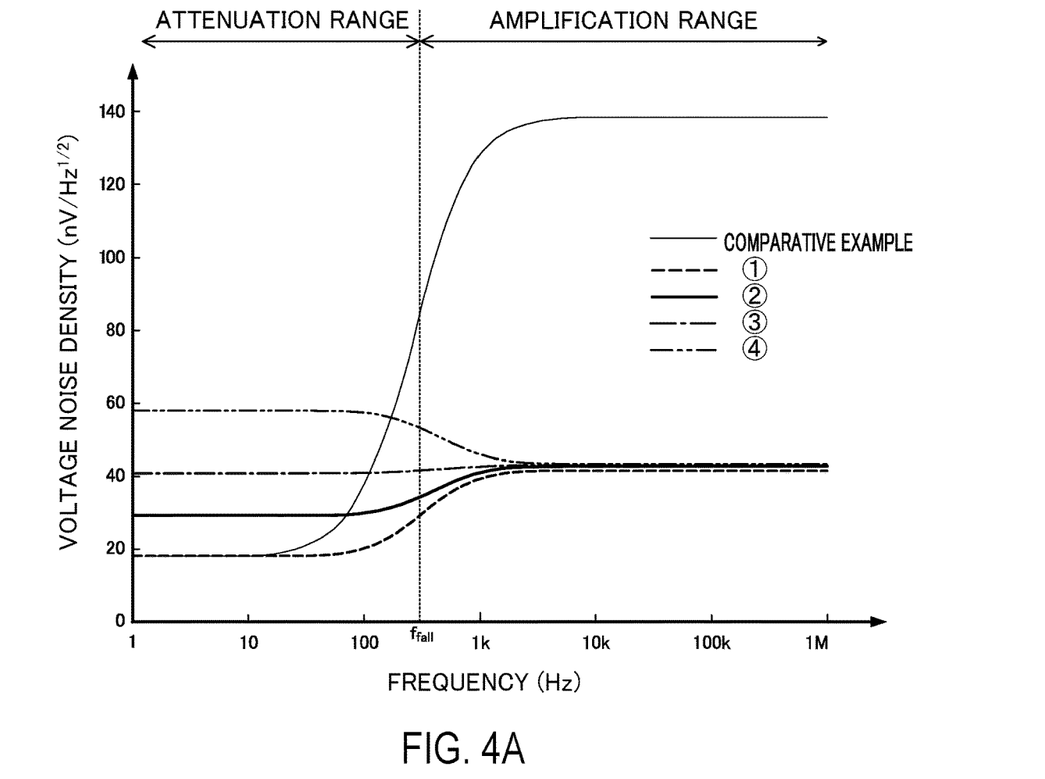
FIG. 4A is a diagram for explaining a frequency characteristic of a thermal noise component of the amplifier circuit.

FIG. 4A is a diagram showing the frequency characteristic of a voltage noise density obtained by a simulation analysis of the amplifier circuit 100. FIG. 4B is a diagram showing numerical values for circuit element constants that are respectively set for each frequency characteristic shown in FIG. 4A. FIG. 4B shows, in addition to the setting conditions of the circuit elements, the upper limit $G_{max}$ of the gain and the falling frequency $f_{fall}$ of the gain in the amplifier circuit 100.

Figure 4B:
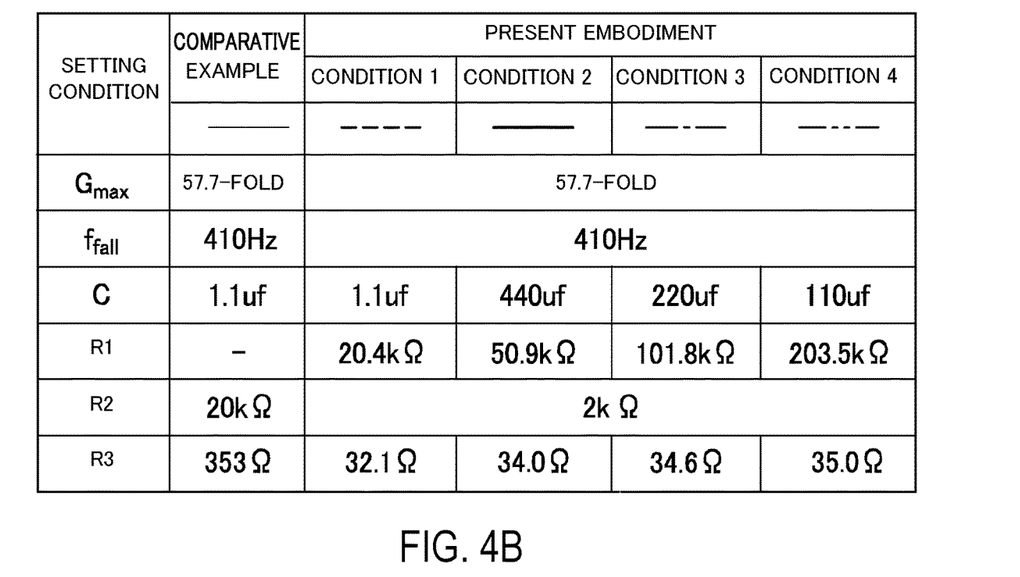
FIG. 4B is a diagram showing setting conditions of parameters for the amplifier circuit having the frequency characteristic shown in FIG. 4A.

As shown in FIG. 4B, in a state in which the resistance value R2 of the resistance element 121 is fixed to 2 [kΩ], the capacitance value C of the capacitive element 130, the resistance value R1 of the resistance element 110, and the resistance value R3 of the resistance element 122 are changed such that the upper limit $G_{max}$ of the gain and the falling frequency $f_{fall}$ of the gain are kept constant.

Under the above-described setting condition, as shown in FIG. 4A, it is understood that the voltage noise density of the amplifier circuit 100 in this embodiment is relatively lower than the voltage noise density of the non-inverting amplifier circuit 900 in the amplification range.

Next, the frequency characteristic of the equivalent source impedance in the amplifier circuit 100 shown in FIG. 2 will be described with reference to FIGS. 5A and 5B. The term "the equivalent source impedance" refers to an impedance when the feedback units 11 and 12 configuring the feedback circuit are seen from the operational amplifier 10. The noise is generated when the equivalent source impedance acts on (multiplication) the current noise inherent in the operational amplifier 10. Thus, the higher the equivalent impedance is, the larger the noise becomes.

Figure 5A:
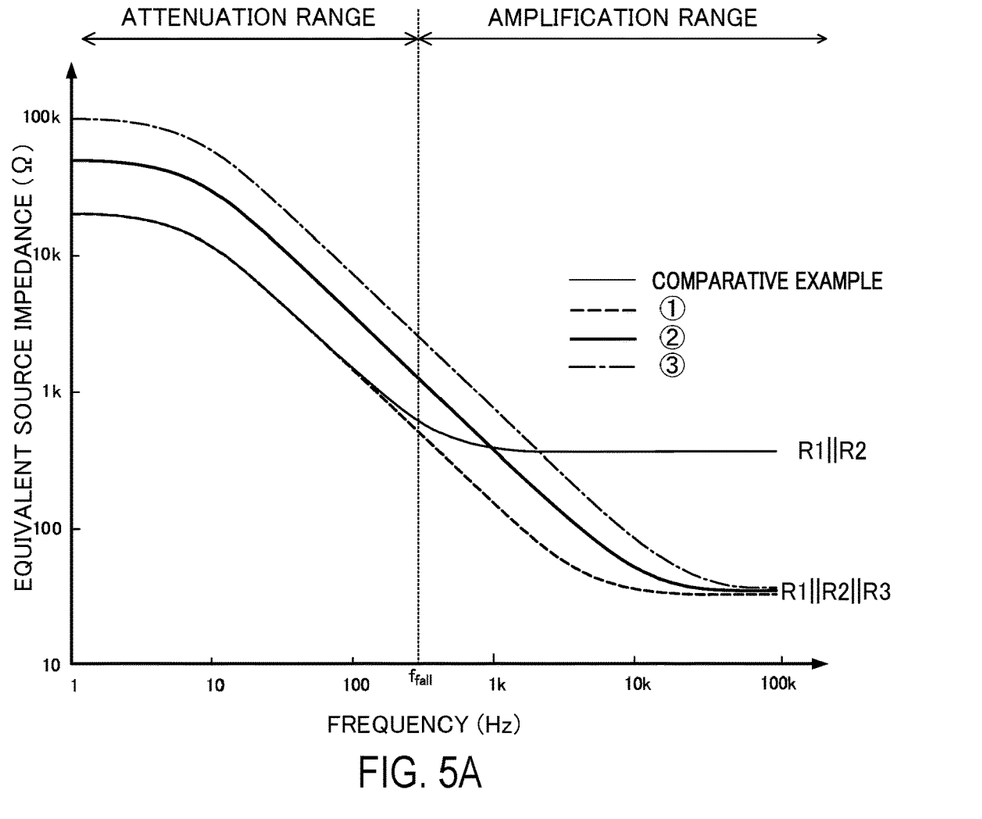
FIG. 5A is a diagram for explaining a frequency characteristic of an equivalent source impedance of the amplifier circuit.

FIG. 5A is a diagram showing the frequency characteristic of the equivalent source impedance obtained by using the equation derived from the circuit equation of the amplifier circuit 100. FIG. 5B is a diagram showing numerical values for circuit element constants that are respectively set for the above-described equation for each frequency characteristic shown in FIG. 5A.

Figure 5B:
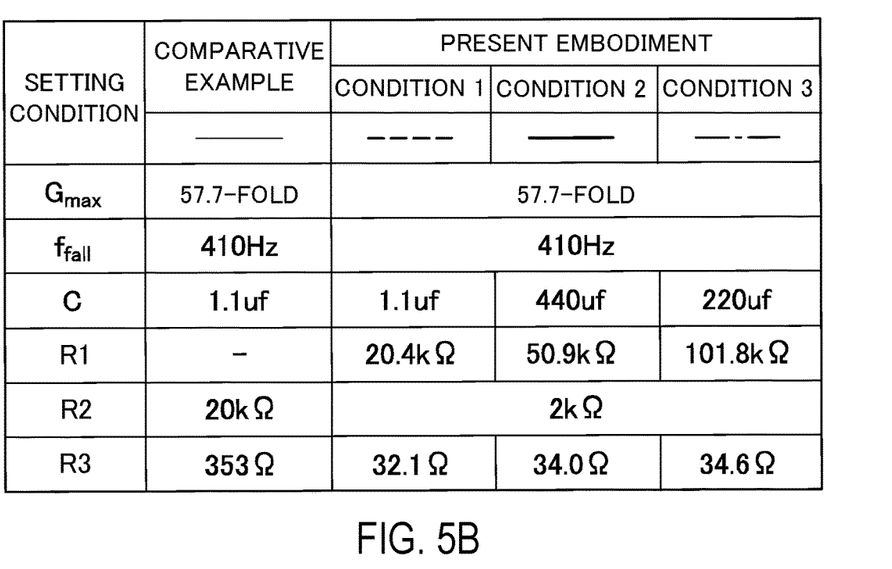
FIG. 5B is a diagram showing setting conditions of parameters for the amplifier circuit having the frequency characteristic shown in FIG. 5A.

As shown in FIG. 5B, in a state in which the resistance value R2 of the resistance element 121 is fixed to 2 [kΩ], the capacitance value C of the capacitive element 130, the resistance value R1 of the resistance element 110, and the resistance value R3 of the resistance element 122 are changed such that the upper limit $G_{max}$ of the gain and the falling frequency $f_{fall}$ of the gain are kept constant.

Under the above-described setting condition, as shown in FIG. 5A, it is understood that the equivalent source impedance of the amplifier circuit 100 is relatively lower than the equivalent source impedance of the non-inverting amplifier circuit 900 in the amplification range. This is because, in the amplification range of the amplifier circuit 100, the resistance values R2 and R3 of the resistance elements 121 and 122, on which the current noise of the operational amplifier 10 mainly acts, are respectively set to values smaller than the resistance values of the resistance elements 91 and 92 of the non-inverting amplifier circuit 900.

As described above, in the amplifier circuit 100 of this embodiment, compared with the non-inverting amplifier circuit 900, it is possible to make both of the voltage noise density and the equivalent source impedance in the amplification range lower.

Next, a method of suppressing the manufacturing cost and the size of the amplifier circuit 100 will be described.

In this embodiment, because the capacitive element 130 is configured of the temperature compensating ceramic capacitor, the manufacturing cost and the size of the amplifier circuit 100 are increased when the capacitance value C is increased compared with a case in which the resistance value R1 of the resistance element 110 is increased.

Thus, the non-inverting amplifier circuit 900 shown in FIG. 8 is employed as a comparison target for the amplifier circuit 100, and conditions for reducing the manufacturing cost and the size of the amplifier circuit 100 while suppressing the increase in the noise generated in the amplifier circuit 100 will be considered. In the following, for the amplifier circuit 100 and the non-inverting amplifier circuit 900, both circuits are compared by keeping the resistance values R2 of both circuits constant without changing them.

The capacitance value C of the capacitive element 93 of the non-inverting amplifier circuit 900 can be expressed as in the following equation (3) by using the upper limit $G_{max}$ of the gain and the falling frequency $f_{fall}$.

[Numerical Equation 2]

$$C = \frac{G_{max} - 1}{2\pi \cdot f_{fall} \cdot R2} \quad (3)$$

On the other hand, the capacitance value C of the capacitive element 130 of the amplifier circuit 100 can be expressed as in the following equation (4) by using the upper limit $G_{max}$ of the gain and the falling frequency $f_{fall}$.

[Numerical Equation 3]

$$C = \frac{G_{max}}{2\pi \cdot f_{fall} \cdot R1} \quad (4)$$

In a case in which the amplifier circuit 100 and the non-inverting amplifier circuit 900 are designed such that both of the upper limit $G_{max}$ of the gain and the falling frequency $f_{fall}$ have the same value, in order to make the capacitance value of the capacitive element 130 smaller than the capacitance value of the capacitive element 93, it is necessary to satisfy the relationship expressed in the following equation (5).

[Numerical Equation 4]

$$\frac{G_{max} - 1}{2\pi \cdot f_{fall} \cdot R2} > \frac{G_{max}}{2\pi \cdot f_{fall} \cdot R1} \quad (5)$$

In other words, by satisfying the relationship of the following equation (6), which is obtained by rearranging both sides of the above-described equation (5), it is possible to make the capacitance value C of the capacitive element 130 of the amplifier circuit 100 smaller than the capacitance value of the capacitive element 93 of the non-inverting amplifier circuit 900.

[Numerical Equation 5]

$$\frac{G_{max} - 1}{R2} > \frac{G_{max}}{R1} \quad (6)$$

In the above, because the upper limit $G_{max}$ of the gain of the amplifier circuit 100 can be expressed as in the above-described equation (1), by substituting the equation (1) into the upper limit $G_{max}$ of the gain in the above-described equation (6), the following equation (7) is derived.

[Numerical Equation 6]

$$R1 > \frac{R2 + R3 + \sqrt{(R2 + R3)^2 + 4 \cdot R2 \cdot R3}}{2} \quad (7)$$

From the relationship expressed in the above-described equation (7), it can be seen that the resistance values R1, R2, and R3 of the resistance elements 110, 121, and 122 satisfy the relationship expressed in the following equation (8).

[Numerical Equation 7]

$$R1 > R2 + R3 \quad (8)$$

Therefore, by making the resistance value R1 of the resistance element 110 larger than the combined resistance value (R2+R3) of the resistance element 121 and the resistance element 122 as in the above-described equation (8), it is possible to make the capacitive element 130 of the amplifier circuit 100 smaller than the capacitive element 93 of the non-inverting amplifier circuit 900 shown in FIG. 8.

As described above, by increasing the resistance value R1 of the resistance element 110, it is possible to reduce the capacitance value C of the capacitive element 130 without increasing the resistance value R2 of the resistance element 121. In other words, by increasing the resistance value R1 of the resistance element 110, it is possible to reduce the cost and the size required for the capacitive element 130 while suppressing the noise generated in the resistance element 121.

Next, operational advantages achieved in the first embodiment will be described in detail.

The amplifier circuit 100 that amplifies the input signal to be input to the non-inverting input terminal (+) of the operational amplifier 10 in this embodiment includes the first and second feedback units 11 and 12 that feed back the output signal output from the operational amplifier 10 to the inverting input terminal (−) of the operational amplifier 10. Furthermore, the amplifier circuit 100 includes the coupling unit 13 that AC couples the second the feedback unit 12 and the inverting input terminal (−) of the operational amplifier 10.

As the frequency of the output signal from the operational amplifier 10 is increased, the first the feedback unit 11, together with the coupling unit 13, makes the electric potential to be applied to the inverting input terminal (−) of the operational amplifier 10 lower than the output signal from the operational amplifier 10. In addition, the second the feedback unit 12 generates the lower limit electric potential $V_L$ as a predetermined electric potential that is lower than the electric potential Vout of the output signal of the operational amplifier 10 and applies the lower limit electric potential $V_L$ (a predetermined electric potential) to the inverting input terminal (−) of the operational amplifier 10 via the coupling unit 13.

According to this configuration, as the frequency of the output signal from the operational amplifier 10 is increased, the feedback unit 11 and the coupling unit 13 reduce the electric potential to be applied to the inverting input terminal (−) of the operational amplifier 10 such that the lower limit electric potential $V_L$ generated at the feedback unit 12 is set as the lower limit. By doing so, as the frequency of the output signal from the operational amplifier 10 is increased, the feedback ratio of the amplifier circuit 100 becomes smaller than "1", and so, the gain of the amplifier circuit 100 becomes larger than "1".

Thus, it becomes possible to adjust the frequency characteristic of the gain in the amplifier circuit 100 in accordance with the constants of the feedback unit 11 and the coupling unit 13, whereas it becomes possible to adjust the upper limit $G_{max}$ of the gain of the amplifier circuit 100 in accordance with the level of the lower limit electric potential $V_L$ generated at the feedback unit 12.

Therefore, it is possible to independently adjust the gain of the amplifier circuit 100 and the frequency characteristic thereof. Thus, it is possible to reduce the noise component of the output signal while increasing the upper limit $G_{max}$ of the gain of the amplifier circuit 100 by several ten-fold or several hundred-fold.

In addition, the coupling unit 13 in this embodiment includes the capacitive element 130 that is connected between the feedback unit 12 and the inverting input terminal (−) of the operational amplifier 10, and the feedback unit 12 includes the voltage dividing circuit that generates the lower limit electric potential $V_L$ by dividing the output signal from the operational amplifier 10.

According to this configuration, by configuring the feedback unit 12 with the voltage dividing circuit, it is possible to reduce the noise to be mixed in the feedback signal from the feedback unit 12 compared with a general voltage generating circuit serving as the noise source. In addition, by configuring the coupling unit 13 with the capacitive element 130, because the rate at which the lower limit electric potential $V_L$ is transferred to the inverting input terminal (−) of the operational amplifier 10 in the amplification range including the high-frequency band, in which the gain reaches the upper limit $G_{max}$, is increased, it is possible to appropriately select the frequency with a simple configuration.

Therefore, with the above-described configuration, it is possible to reduce the noise component of the feedback signal to be input to the inverting input terminal (−) of the operational amplifier 10 while making the circuit configuration of the amplifier circuit 100 simple.

In addition, the feedback unit 11 in this embodiment has the resistance element 110 as the first impedance element that is connected between the output terminal and the inverting input terminal (−) of the operational amplifier 10. In addition, the voltage dividing circuit configuring the feedback unit 12 is configured of the resistance element 121 and the resistance element 122.

The resistance element 121 functions as the second impedance element that is connected in parallel to the resistance element 110 via the coupling unit 13. In addition, the resistance element 122 functions as the third impedance element that is connected between the ground electric potential GND and the connection point N3 between the resistance element 121 and the coupling unit 13, and the ground electric potential GND is used as the reference electric potential serving as the reference for the input signal to be input to the non-inverting input terminal (+) of the operational amplifier 10.

According to this configuration, by configuring the feedback unit 11 with the resistance element 110 that is the passive element, it is possible to reduce the noise component generated at the feedback unit 11 compared with an active element while making the circuit configuration of the amplifier circuit 100 simple. Similarly, by configuring the voltage dividing circuit of the feedback unit 12 with two resistance elements 121 and 122, it is possible to achieve both of the simplification of the circuit configuration and the reduction of the noise component.

The resistance element 110 that functions as the first impedance element in this embodiment has a higher resistance value, in other words, a higher impedance value than the resistance element 121.

In the amplification range of the amplifier circuit 100, because a degree of influence of the noise generated at the resistance element 110 to the output of the amplifier circuit 100 is reduced, it is possible to increase the resistance value R1 of the resistance element 110 in preference to the capacitance value C of the capacitive element 130. Thus, by increasing the resistance value R1 of the resistance element 110 so as to be higher than the resistance value R2 of the resistance element 121, it is possible to reduce the cost and the size of the capacitive element 130 while suppressing the increase in the noise in the amplification range.

In this embodiment, the gain of the amplifier circuit 100 is adjusted in accordance with the ratio (R2/R3) of the resistance element 121 to the resistance element 122, and in the frequency band in which the gain of the amplifier circuit 100 is attenuated, the gain of the amplifier circuit 100 is adjusted in accordance with the multiplication value (R1·C) of the resistance element 110 and the capacitive element 130.

As described above, according to the configuration in this embodiment, it is possible to separately adjust the gain of the amplifier circuit 100 and the frequency characteristic of the gain. Therefore, it is possible to increase the degree of freedom for the setting of the constants of the circuit elements of the amplifier circuit 100.

In addition, the resistance element 110 in this embodiment has the resistance component (R1) that is larger than the value (R2+R3) obtained by adding the resistance component of the resistance element 121 and the resistance component of the resistance element 122 configuring the voltage dividing circuit.

According to this configuration, the suppression of the thermal noise component generated at the feedback unit 12 in the amplification range of the amplifier circuit 100 can be achieved greatly relative to the suppression of the thermal noise component generated at the feedback unit 11 in the attenuation range.

In addition, by increasing the resistance value R1 of the resistance element 110 so as to be larger than the addition value (R2+R3), it is possible to reduce the capacitance value C relative to the non-inverting amplifier circuit 900 shown in FIG. 8. Therefore, it is possible to attenuate the gain of the frequency band having a lower frequency than the signal component of the input signal in the amplifier circuit 100 while suppressing the manufacturing cost and the size of the amplifier circuit 100.

In addition, the coupling unit 13 in this embodiment is configured of the ceramic capacitor. With such a configuration, the variation of the capacitance value C due to the temperature change and the aging deterioration of the coupling unit 13 is reduced relative to that of a general capacitor, and so, it is possible to suppress the variation of the characteristic of the amplifier circuit 100.

Especially, by adjusting component constant of the amplifier circuit 100 so as to satisfy the relationship expressed in the above-described equation (8), the capacitance value C can be made smaller compared with the non-inverting amplifier circuit 900, and so, it is possible to suppress the size and the cost of the ceramic capacitor. Therefore, it is possible to effectively reduce the increase in the manufacturing cost and the size of the amplifier circuit 100.

Second Embodiment

Figure 6:
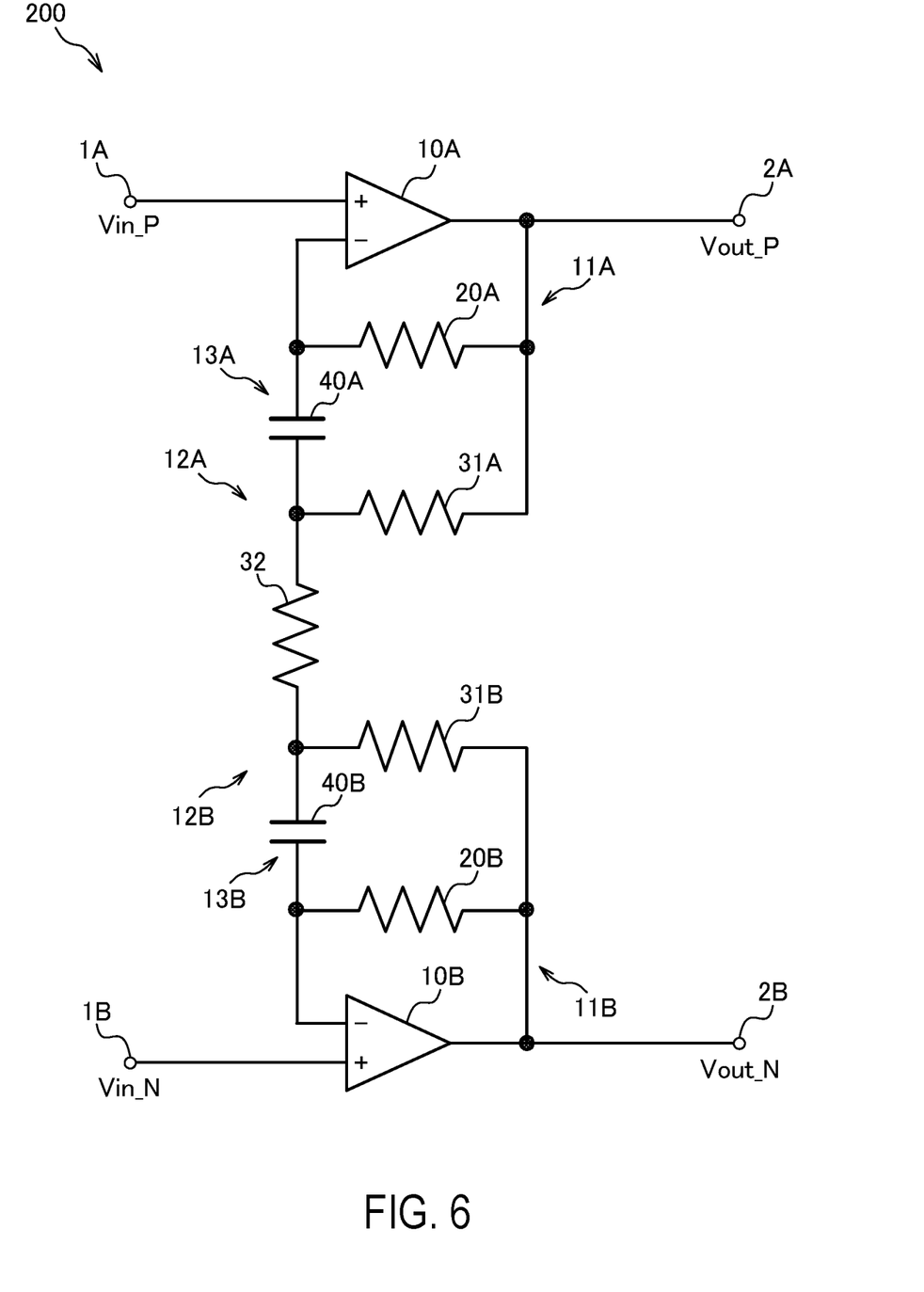
FIG. 6 is a circuit diagram showing a configuration of the amplifier circuit in a second embodiment.

FIG. 6 is a circuit diagram showing a configuration of a differential amplifier circuit 200 in a second embodiment.

In the differential amplifier circuit 200, the amplifier circuit 100 shown in FIG. 1 is applied to a differential amplifier circuit. The differential amplifier circuit 200 is provided with a positive-side operational amplifier 10A, a positive-side feedback unit 11A, a positive-side feedback unit 12A, a positive-side coupling unit 13A, a negative-side operational amplifier 10B, a negative-side feedback unit 11B, a negative-side feedback unit 12B, and a negative-side coupling unit 13B.

The positive-side feedback unit 11A and the negative-side feedback unit 11B correspond to the feedback unit 11 shown in FIG. 1. The positive-side feedback unit 11A and the negative-side feedback unit 11B in this embodiment have impedance elements, and they are respectively configured of a resistance element 20A and a resistance element 20B.

The positive-side feedback unit 12A and the negative-side feedback unit 12B correspond to the feedback unit 12 shown in FIG. 1. The positive-side feedback unit 12A and the negative-side feedback unit 12B in this embodiment are respectively configured of the voltage dividing circuits.

Similarly to the feedback unit 12 shown in FIG. 1, the voltage dividing circuit configuring the positive-side feedback unit 12A has a resistance element 31A and a resistance element 32 as a plurality of impedance elements. The voltage dividing circuit configuring the negative-side feedback unit 12B has a resistance element 31B and the resistance element 32 as a plurality of impedance elements. As shown in FIG. 6, the resistance element 32 is a common voltage dividing resistor between the voltage dividing circuits respectively configuring the positive-side feedback unit 12A and the negative-side feedback unit 12B.

The positive-side coupling unit 13A and the negative-side coupling unit 13B correspond to the coupling unit 13 shown in FIG. 1. The positive-side coupling unit 13A and the negative-side coupling unit 13B in this embodiment are respectively configured of a capacitive element 40A and a capacitive element 40B.

Similarly to the first embodiment, in the differential amplifier circuit 200, the upper limit of the gain of the output signal generated at the output terminal 2A corresponding to the input signal applied to an input terminal 1A is adjusted in accordance with the constants (the resistance values) of the resistance elements 31A and 32. The frequency characteristic of the gain is adjusted in accordance with the constants of the resistance element 20A and the capacitive element 40A.

Similarly, the upper limit of the gain of the output signal of the output terminal 2B corresponding to the input signal of an input terminal 1B is adjusted in accordance with the constants of the resistance elements 31B and 32, and the frequency characteristic of the gain is adjusted in accordance with the constants of the resistance element 20B and the capacitive element 40B.

As described above, even in the differential amplifier circuit 200, it is possible to independently adjust both of the upper limit of the gain and the frequency characteristic of the gain.

Third Embodiment

Figure 7:
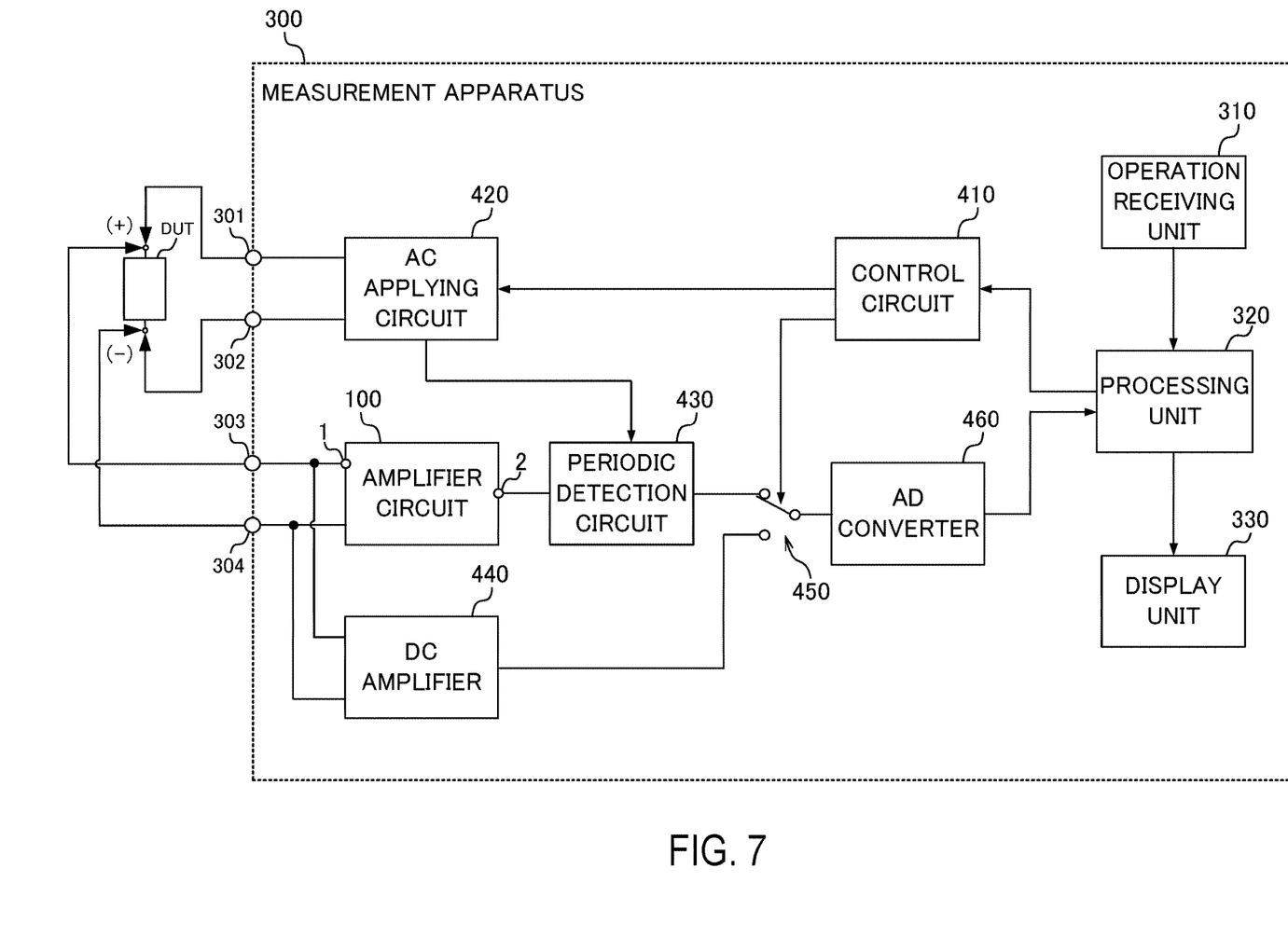
FIG. 7 is a block diagram showing a functional configuration of a measurement apparatus provided with the amplifier circuit in a third embodiment.

FIG. 7 is a block diagram showing a configuration of a measurement apparatus 300 in a third embodiment.

In the measurement apparatus 300, the amplifier circuit 100 shown in FIG. 1 is applied to a measurement apparatus for measuring an impedance of a device under test DUT (Device Under Test). In this embodiment, the device under test DUT is a power storage device configured of a secondary battery, an electric double layer, or the like, and the measurement apparatus 300 is, for example, a battery tester.

The measurement apparatus 300 is provided with, in addition to the amplifier circuit 100, a operation receiving unit 310, a processing unit 320, a display unit 330, a control circuit 410, an AC applying circuit 42, a synchronous detection circuit 430, a DC amplifier 440, a switch 450, and an AD converter 460.

The operation receiving unit 310 is formed of a keyboard, a mouse, a touch panel, and so forth. The operation receiving unit 310 receives an operation signal generated by an input operation performed by a measurer, and the operation signal is output to the processing unit 320. The operation receiving unit 310 receives, for example, the operation signal instructing measurement of a DC voltage or measurement of an impedance.

The processing unit 320 is configured of a computer having a processor. When the processing unit 320 acquires the operation signal instructing the measurement of the impedance from the operation receiving unit 310, the processing unit 320 supplies the control circuit 410 with a control signal for applying the AC signal to the device under test DUT.

In addition, when the processing unit 320 acquires measurement data indicating a response signal generated in the device under test DUT from the AD converter 460, the processing unit 320 calculates the impedance of the device under test DUT on the basis of the response signal indicated by the measurement data. The processing unit 320 then outputs a calculation result for the impedance to the display unit 330.

The display unit 330 is formed of a liquid crystal display, an organic EL display, or the like. The display unit 330 displays, for example, a measurement result of the impedance.

The control circuit 410 controls respective operations of the AC applying circuit 420 and the switch 450 in accordance with the control signals from the processing unit 320. For example, when the processing unit 320 executes a measurement process for the DC voltage, the control circuit 410 outputs a stop command of the AC signal to the AC applying circuit 420 and switches connection state of the switch 450 such that the DC amplifier 440 and the AD converter 460 are connected.

In addition, when the processing unit 320 executes the measurement process for the impedance, the control circuit 410 outputs an application command of the AC signal to the AC applying circuit 420 and switches connection state of the switch 450 such that the synchronous detection circuit 430 and the AD converter 460 are connected.

When the AC applying circuit 420 receives the application command of the AC signal from the control circuit 410, the AC applying circuit 420 applies the AC signal of a predetermined frequency to the device under test DUT. At this time, the AC applying circuit 420 supplies the synchronous detection circuit 430 with a synchronization signal having the same phase as the AC signal to be applied to the device under test DUT.

For example, the AC applying circuit 420 applies an AC current of 1 [kHz] between a positive electrode and a negative electrode of a power storage device configuring the device under test DUT. In this state, the AC voltage generated between the electrodes of the device under test DUT is detected by a pair of probes as the response signal.

The amplifier circuit 100 is an AC amplifier that amplifies the response signal output from the device under test DUT. In this embodiment, a connection terminal 303 of the positive-side probe is connected to the input terminal 1 of the amplifier circuit 100, and an electric potential of a connection terminal 304 of the negative-side probe is used as the reference electric potential of the amplifier circuit 100. For example, instead of the ground electric potential GND shown in FIG. 2, the connection terminal 304 of the negative-side probe is connected to the one end of the resistance element 122.

The amplification range of the amplifier circuit 100 is designed so as to include the signal component of 1 [kHz]. Therefore, the amplifier circuit 100 amplifies the response signal from the device under test DUT at a predetermined gain, for example, several ten-fold and limits the amplification of the DC voltage of the device under test DUT. As described above, by limiting the amplification of the DC voltage, it is possible to avoid output saturation of the amplifier circuit 100. The amplifier circuit 100 outputs the amplified response signal to the synchronous detection circuit 430.

The synchronous detection circuit 430 detects frequency component having the same phase as the synchronization signal of the amplified response signal on the basis of the synchronization signal supplied from the AC applying circuit 420. Specifically, the synchronous detection circuit 430 multiplies the response signal amplified by the amplifier circuit 100 by the synchronization signal and extracts the AC voltage having the same phase as the AC current applied to the device under test DUT from the amplified response signal. The synchronous detection circuit 430 then outputs the response signal indicating thus-extracted AC voltage to a first input terminal of the switch 450.

The DC amplifier 440 amplifies the DC voltage of the device under test DUT. The DC amplifier 440 then outputs the DC signal indicating thus-amplified DC voltage to a second input terminal of the switch 450.

The switch 450 switches, in accordance with the command from the control circuit 410, the circuit to be connected to the AD converter 460 to the synchronous detection circuit 430 or the DC amplifier 440. For example, when the impedance measurement is to be executed, the switch 450 outputs the response signal from the synchronous detection circuit 430 to the AD converter 460. On the other hand, when the measurement of the DC voltage is to be executed, the switch 450 outputs the DC signal from the DC amplifier 440 to the AD converter 460.

The AD converter 460 converts the signal output from the switch 450 from an analog signal to a digital signal. The AD converter 460 outputs thus-converted digital signal to the processing unit 320 as the measurement data.

By doing so, the processing unit 320 detects the response signal indicated by the measurement data. Furthermore, the processing unit 320 calculates the impedance of the device under test DUT by using the detected response signal and the applied AC signal. As described above, the processing unit 320 configures a measurement unit that measures a physical quantity of the device under test DUT on the basis of the output signal from the amplifier circuit 100.

In this embodiment, by applying the amplifier circuit 100 to the measurement apparatus 300, it is possible to reduce the noise that is generated by the current acting on the circuit element while amplifying the response signal in the amplifier circuit 100. In addition, because the output saturation of the amplifier circuit 100 is suppressed by suppressing the amplification of the DC signal while amplifying the response signal, the amplifier circuit 100 can amplify the response signal appropriately.

In addition, by configuring the amplifier circuit 100 with the non-inverting amplifier circuits, compared with a configuration with the inverting amplifier circuits, the input impedance is high, and so, it is possible to reduce the current flowing from the device under test DUT into the amplifier circuit 100. With such a configuration, a decrease in a response voltage due to inflow current is suppressed, and so, it is possible to measure the impedance of the device under test DUT with high accuracy.

Next, operational advantages achieved in the third embodiment will be described.

The measurement apparatus 300 in this embodiment includes the amplifier circuit 100 that amplifies the input signal input from the device under test DUT and the processing unit 320 that functions as the measurement unit that measures the physical quantity of the device under test DUT on the basis of the output signal from the amplifier circuit 100.

According to this configuration, it is possible to suppress the amplification of the low-frequency component while amplifying the high frequency component of the input signal input to the amplifier circuit 100. Thus, the output saturation of the amplifier circuit 100 is suppressed, and so, it is possible to amplify the input signal appropriately.

Although the respective embodiments of the present invention have been described in the above, the above-mentioned embodiments merely illustrate a part of application examples of the present invention, and the technical scope of the present invention is not intended to be limited to the specific configurations of the above-described embodiments.

The present application claims priorities based on Japanese Patent Application 2020-206343 filed with the Japan Patent Office on Dec. 11, 2020, the entire contents of which are incorporated into this specification by reference.

REFERENCE SIGNS LIST 10A, 10B operational amplifier
11, 11A, 11B feedback unit (first feedback unit)
12, 12A, 12B feedback unit (second feedback unit)
13 coupling unit
100 amplifier circuit
110 resistance element (impedance element)
121, 122 resistance element (impedance element, voltage dividing circuit)
130 capacitive element
200 differential amplifier circuit (amplifier circuit)
300 measurement apparatus

The invention claimed is:

1. An amplifier circuit configured to amplify an input signal input to a non-inverting input terminal of an operational amplifier, the amplifier circuit comprising:
first and second feedback components configured to feed back an output signal output from the operational amplifier to an inverting input terminal of the operational amplifier; and
a coupling component configured to AC couple the second feedback component and the inverting input terminal of the operational amplifier, wherein
the first feedback component is configured to, together with the coupling component, as a frequency of the output signal is increased, reduce an electric potential to be applied to the inverting input terminal of the operational amplifier with respect to the output signal, and the second feedback component is configured to generate a predetermined electric potential lower than an electric potential of the output signal, the second feedback component being configured to apply the predetermined electric potential to the inverting input terminal of the operational amplifier via the coupling component.

2. The amplifier circuit according to claim 1, wherein the coupling component is a capacitive element connected between the second feedback component and the inverting input terminal of the operational amplifier, and the second feedback component includes a voltage dividing circuit, the voltage dividing circuit being configured to generate the predetermined electric potential by dividing the output signal.

3. The amplifier circuit according to claim 2, wherein the first feedback component has a first impedance element connected between an output terminal of the operational amplifier and the inverting input terminal, and the voltage dividing circuit comprises:
  a second impedance element connected in parallel to the first impedance element via the coupling component; and
  a third impedance element connected between a reference electric potential serving as a reference of the input signal and a connection point between the second impedance element and the coupling component.

4. The amplifier circuit according to claim 3, wherein the first impedance element has a higher impedance value than the second impedance element.

5. The amplifier circuit according to claim 3, wherein a gain of the amplifier circuit is adjusted in accordance with a ratio of the second impedance element to the third impedance element, and a frequency band in which the gain of the amplifier circuit is attenuated is adjusted in accordance with a value obtained by multiplying the first impedance element by the capacitive element.

6. The amplifier circuit according to claim 3, wherein the first impedance element has a resistance component larger than a value obtained by adding a resistance component of the second impedance element and a resistance component of the third impedance element.

7. The amplifier circuit according to claim 1, wherein the coupling component is a ceramic capacitor.

8. A measurement apparatus comprising:
the amplifier circuit according to claim 1; and
a measurement device configured to measure a physical quantity of a measurement object based on the output signal from the amplifier circuit, the measurement object being configured to input the input signal to the amplifier circuit.

* * * * *